(12) United States Patent
Santan et al.

(10) Patent No.: US 8,560,295 B1
(45) Date of Patent: Oct. 15, 2013

(54) SUSPENSION OF PROCEDURES IN SIMULATION OF AN HDL SPECIFICATION

(75) Inventors: Sonal Santan, San Jose, CA (US); Pratima Gupta, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 264 days.

(21) Appl. No.: 13/027,705

(22) Filed: Feb. 15, 2011

(51) Int. Cl.
*G06F 17/50* (2006.01)

(52) U.S. Cl.
USPC ............... 703/14; 703/13; 703/15; 703/16

(58) Field of Classification Search
USPC ....................................... 703/13–17
See application file for complete search history.

(56) References Cited

U.S. PATENT DOCUMENTS

| | | | | |
|---|---|---|---|---|
| 6,321,366 | B1* | 11/2001 | Tseng et al. ............... | 326/94 |
| 7,895,027 | B2* | 2/2011 | Lin et al. ................. | 703/14 |
| 8,082,141 | B2* | 12/2011 | Hodgson et al. ........... | 703/21 |
| 8,244,512 | B1* | 8/2012 | Tseng et al. ............... | 703/14 |
| 2003/0125920 | A1* | 7/2003 | Matsuoka et al. ........... | 703/15 |
| 2009/0187394 | A1* | 7/2009 | Lin et al. ................. | 703/14 |
| 2011/0307233 | A1* | 12/2011 | Tseng et al. ............... | 703/14 |

OTHER PUBLICATIONS

"Parallel and Distributed Simulation Systems," Richard M. Fujimoto, Georgia Institute of Technology, John Wiley & Sons, Inc. 2000 ("Fujimoto").*
U.S. Appl. No. 12/619,623, filed Nov. 16, 2009, Santan.
Allen, Randy et al., "Optimizing Complied Verilog," *Proc. of the 1994 International Verilog HDL Conference*, Mar. 14, 1994, pp. 15-19, IEEE, Piscataway, New Jersey, USA.
IEEE, *IEEE Standard VHDL Language Reference Manual*, IEEE Std. 1076-2002, May 17, 2002, pp. 1-309, IEEE, New York, New York, USA.
IEEE, *IEEE Standard Verilog Hardware Description Language*, IEEE Std. 1364-2001, Sep. 28, 2001, pp. 1-879, IEEE, New York, New York, USA.

* cited by examiner

*Primary Examiner* — Omar Fernandez Rivas
*Assistant Examiner* — Maryam Ipakchi
(74) *Attorney, Agent, or Firm* — LeRoy D. Maunu

(57) ABSTRACT

In one embodiment, a method to simulate an HDL specification is provided. For each call to a procedure, an intermediate process is dynamically created during simulation. The process containing the call to the procedure is replaced with the intermediate process in an active process list of processes scheduled for execution. The intermediate process is configured to call the procedure and, in response to completing execution of the procedure, cause the simulator to add the calling process to the front of the active process list and remove the intermediate process from the active process list.

20 Claims, 5 Drawing Sheets

SUSPENSION OF PROCEDURES IN SIMULATION OF AN HDL SPECIFICATION

FIELD OF THE INVENTION

One or more embodiments generally relate to the simulation of circuit designs.

BACKGROUND

Due to advancements in processing technology, complex integrated circuits (ICs) can be designed using various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system, the behavior describing the generation and propagation of signals through combinatorial modules from one set of registers to another set of registers. HDLs provide a rich set of constructs to describe the functionality of a module. Modules may be combined and augmented to form even higher level modules.

An HDL design can be synthesized to create a logical network list (netlist), which can be implemented as an IC. Prior to implementation, the HDL design can be simulated to determine whether the design will function as required. Wasted manufacturing costs due to faulty design may thereby be avoided. Numerous tools are available for simulating circuit designs including, for example, high-level modeling systems (HLMS) and HDL simulators.

Two popular HDL languages are VHDL (VHSIC (Very High Speed Integrated Circuits) hardware description language) and Verilog. In VHDL, processes, as specifically called out in a VHDL design description, are automatically executed by a simulator while procedures in the VHDL design description are executed when called by a process. Verilog provides initial/always blocks, as well as tasks, for use in a design description. Initial and always blocks are automatically executed, and tasks are executed when called by an initial/always block. For ease of explanation and brevity, VHDL processes and procedures as well as Verilog initial/always blocks and tasks are generically referred to as processes and procedures herein.

An HDL simulator generally includes an HDL language compiler and a simulation kernel. The compiler converts input HDL files into code that is executable by a simulation kernel. In generating the executable code, the compiler maps HDL constructs into the language constructs of a target language compatible with the simulation kernel. The target language may be a general programming language, such as C/assembly, or some other proprietary language. Every process statement in an HDL design is compiled into a function in the target language. In addition, every HDL procedure is also compiled into a unique function in the target language. As used herein, a compiled process or procedure is simply referred to as the process or procedure. When simulation begins, the simulation kernel reads in the executable code generated by the compiler and executes the code according to the HDL language rules. In particular, a simulation kernel generally executes compiled processes in a loop.

Similar to the manner in which an operating system kernel schedules program execution in a computer system, functions corresponding to active processes are scheduled according to a scheduling algorithm, such as those defined by the HDL standards IEEE-1076 and IEEE-1364. The processes are executed by the simulation kernel to simulate concurrent execution of the processes in hardware over a modeled period of time. After a function has been executed, the kernel executes the other functions until all processes have been simulated for the modeled time period. When all processes have been executed, the kernel reschedules and executes active processes to model the HDL specification for the next time period. In this manner, processes may be iteratively simulated in a loop to model concurrent execution in hardware.

In an HDL simulator, procedures containing wait statements or event control pose a modeling challenge. Similar to a process, a procedure may be suspended at a wait statement or event control contained in the procedure. However, unlike a process statement, a procedure may not be statically elaborated with a reserved portion of memory. Rather, the memory for an instance of a procedure may be reallocated when the procedure completes. This presents various complexities in the implementation of an HDL simulator. For example, declarations inside a procedure may need to be preserved when that procedure is suspended due to a wait statement. This is required because common programming languages such as C/C++ do not provide a way to save the stack of a called function and then use it to resume the function in the same state as it was prior to the wait. In order to address these complexities, a lot of bookkeeping code is required, which may affect the speed of simulation. All or some of the bookkeeping code may be generated by the compiler, which increases complexity of the compiler itself. For the sake of simplicity, wait statements and event control are generically referred to as wait statements herein.

The disclosed embodiments may address one or more of the above issues.

SUMMARY

In one embodiment, a method is provided for simulating a circuit design. One or more processes that are specified in a hardware description language (HDL) description of the circuit design are scheduled in an active process set. The active process set indicates processes to be modeled as concurrently executing processes and concurrent execution of the one or more processes in the active process set is simulated.

In response to a first process of the one or more processes calling a procedure specified by the HDL description during simulation, a second process configured to trigger execution of the procedure is generated. The simulation of concurrent execution of the one or more processes is halted and the first process is replaced with the second process in the active process set. Simulation of concurrent execution of the one or more processes within the active process set is then resumed, beginning with simulation of the second process.

In response to completing simulation of the second process, simulation of concurrent execution of the one or more processes is halted and the second process is replaced with the first process in the active process set. Simulation of concurrent execution of one or more processes within the active process set is resumed beginning with resuming simulation of the first process.

In another embodiment, a method to compile an HDL specification for simulation is provided. For each call to a procedure in the HDL specification, the call to the procedure is replaced with HDL code configured to, when executed, dynamically create an intermediate process during simulation. The HDL code replaces the calling process, containing the call to the procedure, with the intermediate process in an active process list of processes scheduled for execution. The intermediate process is configured to call the procedure and, in response to completing execution of the procedure, cause the simulator to add the calling process to the front of the active process list and remove the intermediate process from the active process list. The modified HDL specification is compiled into a form executable on the simulator.

In yet another embodiment, a system for simulating a circuit design specification is provided. The system includes a processor and a memory unit coupled to the processor. The processor and memory are configured to scheduling one or more processes that are specified in an HDL description of the circuit design in an active process set. The active process set indicates processes to be modeled as concurrently executed processes. The processor and memory are configured to simulate concurrent execution of the one or more processes in the active process set.

In response to a first process of the one or more processes calling a procedure during simulation, the processor and memory generate a second process configured to trigger execution of the procedure and halt simulation of concurrent execution of the one or more processes. The processor and memory replace the first process in the active process set with the second process and resume simulation of concurrent execution of the one or more processes within the active process set, beginning with simulation of the second process.

In response to completing simulation of the second process, the processor and memory halt simulation of concurrent execution of the one or more processes and replace the second process in the active process set with the first process. The processor and memory are configured to resume simulation of concurrent execution of one or more processes within the active process set, beginning with resuming simulation of the first process.

It will be appreciated that various other embodiments are set forth in the Detailed Description and Claims, which follow.

BRIEF DESCRIPTION OF THE DRAWINGS

Various aspects and advantages will become apparent upon review of the following detailed description and upon reference to the drawings, in which:

FIGS. 2-1 through 2-11 illustrate the scheduling and execution of an example set of processes; and FIG. 3 illustrates a block diagram of a computing arrangement on which the processes described herein may be implemented.

DETAILED DESCRIPTION

HDL statements, such as wait statements in a design description, can cause suspension of currently executing function used in simulation of a process in the design. Simulation of these processes requires modeling of state information inside the processes. When a wait statement is encountered in simulating a process, control is returned to the simulation kernel. This is done after recording the code statement at which the process needs to resume, when the wait condition has expired. Procedures require similar modeling since they may also contain HDL statements that can cause suspension. However, if a procedure needs to suspend, the calling process, as well as any intermediary calling procedures, needs to be recursively suspended as well. Following suspension, the control should reach back to the simulation kernel. Local declaration of variables inside the procedure may also need to be preserved. These requirements complicate the modeling of procedures in an HDL simulator.

One or more embodiments provide an efficient method to implement HDL simulation that supports suspension of a procedure by using a dynamically created intermediate process at simulation runtime. The intermediate process is configured to call the procedure when executed, and to cause the simulator to store local variables of the procedure and the resumption point when suspended.

In one or more embodiments, the simulator may be configured to create the intermediate processes, save appropriate resumption points, and add and remove processes from the set of active processes as procedures are called, suspended, or completed. Alternatively, in one or more embodiments, an HDL specification can be compiled to add executable code to the processes to create the intermediate processes, save appropriate resumption points and pointers, and add and remove processes from the set of active processes as procedures are called, suspended, or completed. In either implementation, an intermediate process is dynamically created during simulation runtime, at least for invocations of a procedure containing a wait statement. To simplify implementation, an intermediate process may be created for each procedure regardless of whether the procedure contains a wait statement.

Figure 1:
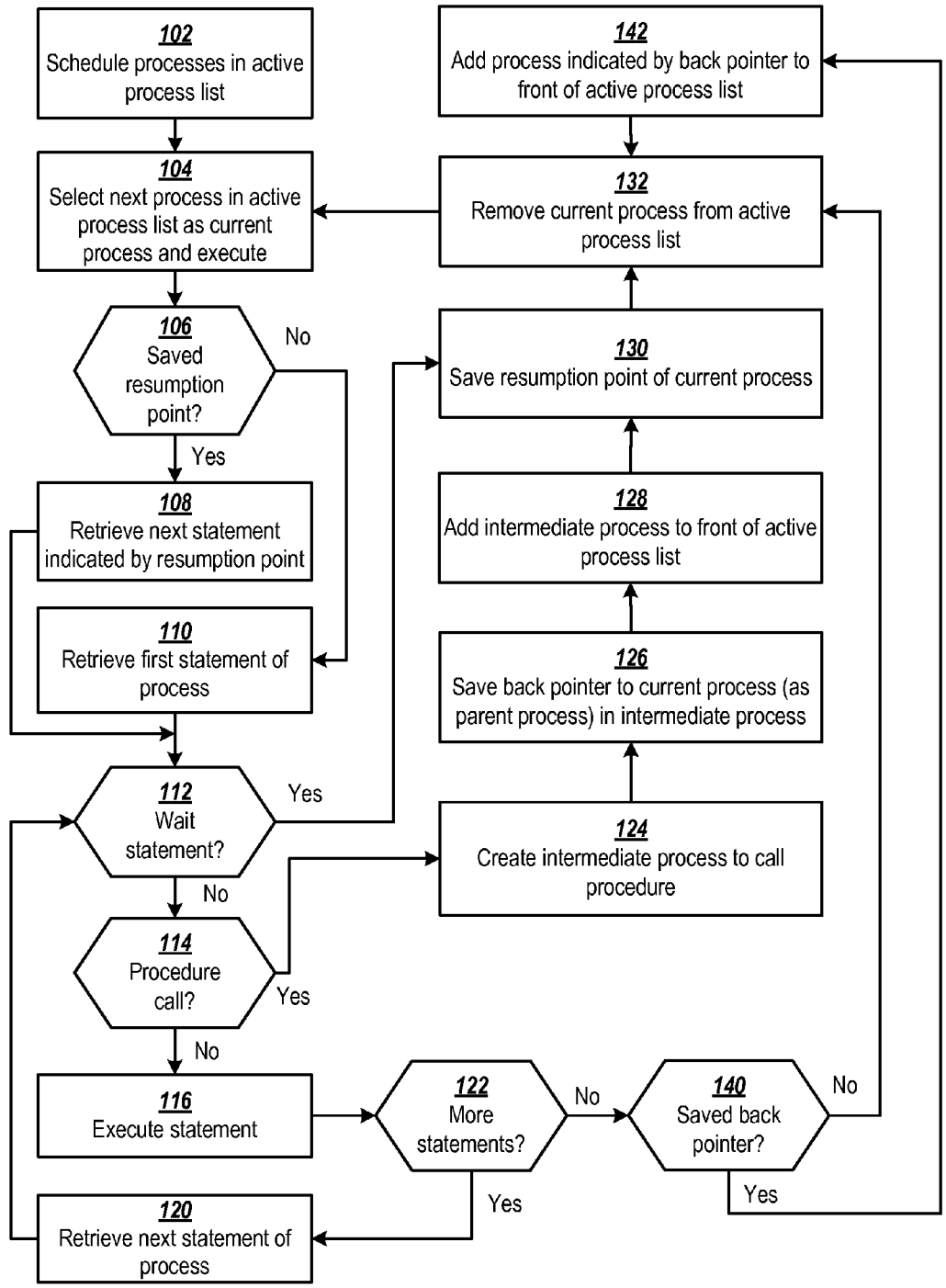
FIG. 1 illustrates a flowchart of a process of simulating a circuit design including a processing, which calls a procedure containing a wait statement.

FIG. 1 illustrates a flowchart of an example process for simulating a circuit design in which procedures may be suspended. HDL processes are added to an active process list at block 102. Processes are iteratively selected in turn from the active process list at block 104 and executed as illustrated in FIG. 1. When a process is executed, the simulator checks whether there is a saved resumption point of the process at decision block 106. If execution of the process was previously halted due to encountering a wait or a call to a procedure, the resumption point indicates the next code statement of the process or procedure to execute. If a resumption point is saved, the statement indicated by the resumption point is retrieved at block 108. Otherwise, the first statement of the process is retrieved at block 110.

If the retrieved statement is a wait statement as determined at decision block 112, a resumption point, which indicates the next statement of the process, is saved at block 130. The process is removed from the active process list at block 132 and the next process in the active process list is selected for execution at block 104 while the wait statement matures.

If the retrieved statement is a procedure call at decision step 114, an intermediate process is created to call the procedure at block 124. A back pointer of the intermediate process is modified to point to the current (calling) process at block 126. The back pointer is used later to determine whether a process was called by a previous "parent" process in a call chain when a process completes. The intermediate process is added to the front of the active process list at block 128. A resumption point of the current process is saved at block 130 and the current process is removed from the active process list at block 132. Once removed, the simulation kernel continues the simulation by executing the next process in the active process list, i.e., the intermediate process at the front of the active process list.

If the retrieved statement is not a wait statement or a call to a procedure, the statement is executed by the simulation kernel at block 116. If the process includes further code statements to execute as determined by decision block 122, the next statement of the process is retrieved at block 120, and the loop continues at decision block 112 as described above. Otherwise, the execution of the process has completed. If execution of the process has completed, the kernel determines at decision block 140 if the process has a back pointer indicating a parent calling process. If the parent process is indicated, the parent process referenced by the back pointer is added to the front of the active process list at block 142. If the back pointer is NULL, then there are no calling processes in the call chain and the process is removed from the active process list at block 132. The kernel continues simulation with the next process in the active process list at block 104.

VHDL/Verilog objects, such as VHDL signal, VHDL variable, Verilog wire, Verilog variables and VHDL type and subtype objects, may need to be elaborated and created in the memory space of the HDL simulator to effect the simulation of the HDL design. Objects declared in the global space, including inside Verilog static tasks, can be statically elaborated and allocated a specific portion of global memory space. These statically elaborated objects may be referred to as globals herein. In contrast, objects declared inside procedures, need to be dynamically elaborated and created for every call to such a procedure. Additionally, dynamic declarations made within a procedure may need to persist across the suspension of the procedure/task.

To support these two requirements, one or more embodiments may be implemented such that the process calling the procedure dynamically allocates a block of memory, referred to as a call block, at simulation runtime. The call block is a container of all the dynamic declarations inside the procedure. The call block also contains bookkeeping data structures, which are used by the simulation runtime. The size of the call block may be pre-computed by the compiler based on the analysis of the declarations inside the procedure at compile time. For automatic declarations, whose size can be computed at compile time, space is reserved by the compiler to store the automatic declarations inside the call block. For those automatic declarations whose size cannot be computed at compile time, space is reserved to store a pointer to the automatic declaration. These formal and automatic declarations inside procedures may be referred to as locals herein.

In one implementation, a design pointer ip is added as one argument to the process, such as with the example statement, void execute_p0(char *ip). The pointer ip references the memory block that contains all the HDL objects for the design unit containing the process. The process indicated by the pointer execute_p0 is called by the simulation kernel when the process becomes active in a simulation cycle. For procedures, which need access to both globals and locals, an additional argument may be added to the procedure, such as in the example statement, void subexecute_s0(char *ip, char *sp). Pointer ip is the design pointer for the design unit containing the procedure subexecute_s0. Pointer sp indicates the call block for the procedure, which is allocated by the caller. The call block indicated by sp may be used to store the locals for the procedure.

A procedure call containing a wait statement is simulated as a dynamic call to an intermediate process, which is dynamically created at simulation runtime. When a procedure call is made, a call block is created by the caller. The call block is big enough to store all the locals of the procedure. A helper routine then wraps the call block into a process object. The helper also inserts the intermediate process object at the front of the active process list (e.g., a linked list of processes scheduled for execution). The caller copies the formals into the correct locations in the newly created call block. The caller then returns to the kernel after storing the resumption point in the caller process object, the resumption point indicating the next HDL statement, and the caller is removed from the active process list. When the simulation kernel executes the next process in the active process list, the intermediate process is executed, which calls the procedure, passing ip and sp as two arguments.

When the call to the procedure returns, control returns to the intermediate process, which checks if the procedure has finished execution or was suspended due to a wait statement. In the case of the former, the intermediate process inserts the parent process that called this procedure at the front of the active process list and the intermediate process is removed from the active process list. This causes the original caller of the procedure to continue execution at the next HDL statement when the kernel selects the next process from the front of the active process list. In the case of the latter, the intermediate process does nothing and is removed from active process list. The kernel is responsible to schedule the intermediate process later when its wait matures. In the case of former, when the calling process or procedure resumes execution, it frees the call block after reading the values from any output mode or input mode formals.

Aspects of one or more embodiments are illustrated by way of an example implementation. Example 1 outlines pseudo-code for two C structures, ProcessProperties and TaskInvocationProperties, that may be used to respectively model processes and procedures/tasks as described above. ProcessProperties models HDL processes. The scheduling order of processes in the active process list is indicated by the mNext pointer of the ProcessProperties data structure. TaskInvocationProperties acts as the initial part of call block sp for procedure calls.

```
struct ProcessProperties
{
// design unit pointer
char* mIp;
// Next resumption point in the process
char* mPstate;
// pointer to the process
ExecFuncPtr mExecFuncPtr;
// pointer to the next process in the active process list
ProcessProperties* mNext;
};
struct TaskInvocationProperties
{
// embedded process inside the task
ProcessProperties mTaskProcess;
// design unit pointer
char* mRealIp;
// pointer to the procedure
ExecTaskFuncPtr mRealExecFuncPtr;
// pointer to the process which called this procedure
ProcessProperties *mCallingProcess;
// is the procedure done executing?
bool mFinished;
};
```

EXAMPLE 1

The active process list indicates pointers to the ProcessProperties data structure of each process. The pointer to the process and the correct design unit pointer ip for each process are obtained from the corresponding ProcessProperties object. Then the call to the process is made by passing the design unit pointer ip as the only argument. The portion of pseudo-code indicated in Example 2, below, illustrates the execution of a process from a pointer stored in a corresponding ProcessProperties object (process_a).

```
while (process_a) {
// process is the head of the active process list
process_a->mExecFuncPtr(process->mlp);
// move the list front to the next process
process_a=process_a->mNext;
}
```

EXAMPLE 2

When a procedure call needs to be made, the calling process uses a helper routine named createIntermediateProcess( ), as shown in Example 3 below, to create an intermediate process, proxyexecute, that is configured to execute the procedure as a process and that can be scheduled in the active process list. The helper function creates an instance of the TaskInvocationProperties data structure shown in Example 1, which acts as the call block. The helper routine also creates a process data structure, mTaskProcess, which is also the first field in the structure and which is initialized with a pointer to itself as its design unit pointer, and the intermediate process proxyexecutestub, as its execute function. Because the process data structure mTaskProcess points back to the procedure data structure TaskInvocationProperties, the call block appears to be a process to the simulation kernel. When mTaskProcess is created, the mNext pointer, which references the next process in the active process list, is set to be equal to the mNext pointer of the parent process that called the procedure. The mNext pointer of the calling process is then made to point to the newly created mTaskProcess. With these two steps, the intermediate process is inserted at the beginning of active process list. The call block also stores the pointer to the procedure together with the design unit pointer.

```
char* createIntermediateProcess (char* callingProcess,
    unsigned callBlockSize, void* subexecute, char *ip)
{
    TaskInvocationProperties *call=malloc(size);
    call->mTaskProcess.pstate=0;
    // Kernel calls execute on the procedureProxyExecuteStub
    // with sp as argument. sp acts as ip for the call
    call->mTaskProcess.mlp=(char *)call;
    call->mTaskProcess.mExecFuncPtr=procedureProxy-
        ExecuteStub;
    call->mFinished=false;
    call->mRealExecFuncPtr=(ExecTaskFuncPtr)sub-
        execute;
    call->mReallp=ip;
    call->mCallingProcess=callingProcess;
    // Insert the new task-process as the next process
    // in the active process list
    callingProcess->mNext=&call->mTaskProcess;
    call->mTaskProcess.mNext=callingProcess->mNext;
    return (char *)call;
}
```

EXAMPLE 3

In this implementation, the intermediate process proxyexecute triggers the call to the procedure and later schedules the original calling process to the front of the active process list when the procedure has finished executing. In some embodiments, the same proxyexecutestub function may be used for all intermediate process proxyexecute functions to affect procedure calls. The proxyexecute is transparently invoked by the kernel in a manner similar to that by which the kernel invokes any other process. In this example, the only argument passed to proxyexecute is the call block itself. As explained above, when the call block was created, it stores its own pointer as design unit pointer and stores a pointer indicating proxyexecute as the process.

When the procedure completes and control returns to the intermediate process proxyexecute, a flag mFinished, stored inside the call block, is checked to determine if the procedure finished or if it was suspended. The procedure sets the flag before returning back to proxyexecute. In case the procedure has finished, mFinished is set to true. In this case, proxyexecute places the calling procedure at the front of the active process list. Proxyexecute sets the mNext of the call block to point to the original calling process and sets the mNext of the original calling process to point to the mNext of the call block. The code snippet below shows the details of function procedureProxyExecuteStub( ):

```
void procedureProxyExecuteStub(char *ip)
{
// IP is actually SP
TaskInvocationProperties *sp=(TaskInvocationProperties
    *)ip;
// Call the procedure
(sp->mRealExecFuncPtr)(sp->mReallp, sp);
if (sp->mFinished) {
    // Schedule the parent calling process/procedure back
        since the
    // callee finished. Add it to the front of the active process
    // linked list.
    sp->mCallingProcess->mNext=sp->mTaskProcess.m-
        Next;
    sp->mTaskProcess.mNext=sp->mCallingProcess;
}
}
```

EXAMPLE 4

Example 5, below, shows a code segment of an example HDL specification that may be simulated using the methods described above. In this example HDL design, process p1 calls procedure sub_process_1, which calls sub_process_2, and sub_process_2 includes a wait statement. When sub_process_2 encounters the wait statement, the call-chain including sub_process_2, sub_process_1, and calling process P1 should all be suspended and should resume with sub_process_2 at the next statement following the wait. However, because procedures sub_process_1 and sub_process_2 are not statically elaborated, the declarations inside each of these procedures, such as vv, aa and bb in sub_process_2 and vv1, vv2, aa1, aa2 and bb in sub_process_1, need to be preserved. Also, the statement where the sub_process_2 needs to resume (bb:=vv) needs to be saved as a resumption point. Similarly, the statement where sub_process_1 need to resume execution when sub_process_2 completes needs to be stored. The appropriate declarations and resumption points are stored for each procedure by respective intermediate processes that are dynamically created in response to a procedure call as described above.

```
procedure sub_process_2 (variable aa: integer; variable
    bb: out integer) variable vv: integer :=aa * 2;
    begin
        wait for 5 ns;
        bb :=vv;
    end procedure;
procedure sub_process_1 (variable aa1, aa2: in integer;
    variable bb: out integer) is
    variable vv1: integer;
    variable vv2: integer;
```

```
    begin
        vv1:=aa1+aa2;
        sub_process_2(vv1, vv2);
        bb :=vv2/vv1;
    end procedure;
P1: process
    variable v1, v2, v3: integer;
    begin
        v1:=10;
        v2:=20;
        wait for 5 ns;
        sub_process_1(v1, v2, v3);
        wait ;
    end process;
```

EXAMPLE 5

FIGS. 2-1 through 2-11 illustrate the scheduling in the active process list 202 of the call chain of the processes and procedures shown in Example 5. In this example, process P1 is scheduled with two other processes, P2 and P3 in the active process list 202. FIG. 2-1 through 2-6 illustrate the state of the active process list 202 as processes P1, P2, and P3 are executed in a first simulation cycle by the simulation kernel.

Figures 1, 2:
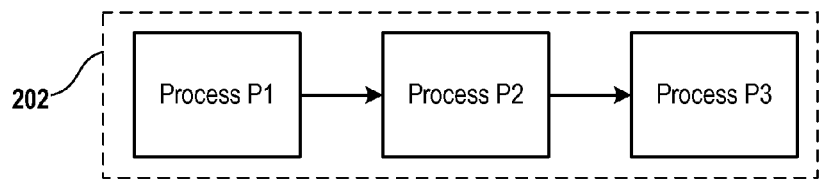
Figure 2:
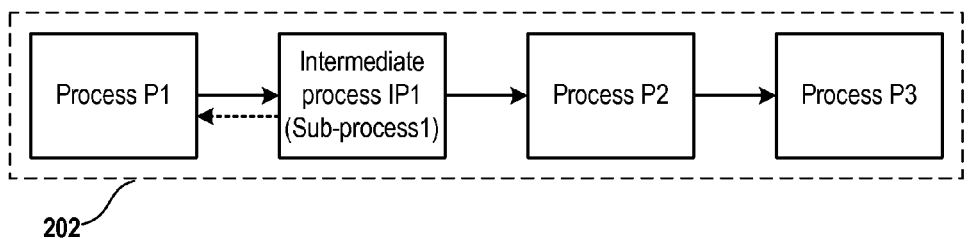

FIG. 2-1 shows the three processes P1, P2, and P3 scheduled in the active process list 202 for simulation by the simulation kernel. The active process list 202 is defined and directed by mNext pointers of each process in the active process list 202. The leftmost process, P1, is at the front of the active process list 202 and is being executed by the simulation kernel.

FIG. 2-2 illustrates the process triggered by process P1 when the procedure call to sub_process_1 is encountered. As described above, an intermediate process IP1 is created which stores a back pointer (indicated as a dashed arrow) to its parent calling process P1. The mNext pointer of intermediate process IP1 is set to the next process P2 in the active process list 202 and the mNext pointer of process P1 is set to point to the intermediate process IP1.

Figures 2, 3:
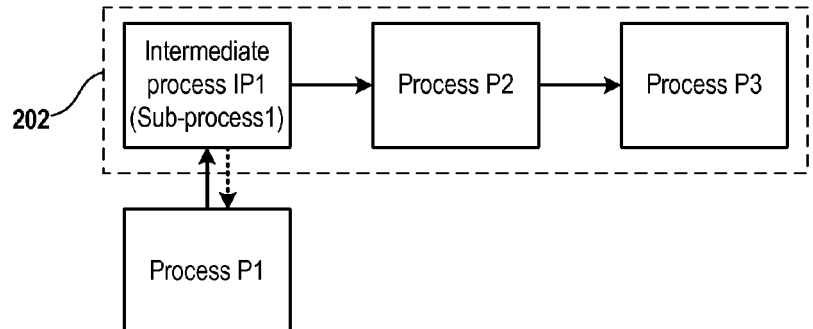

FIG. 2-3 shows removal of process P1 from the active process list 202. The simulation kernel is configured to execute intermediate process IP1 in the same time slot as that of its caller process P1. When executed, intermediate process IP1 is configured to call procedure sub_process_1.

Figures 2, 3, 4:
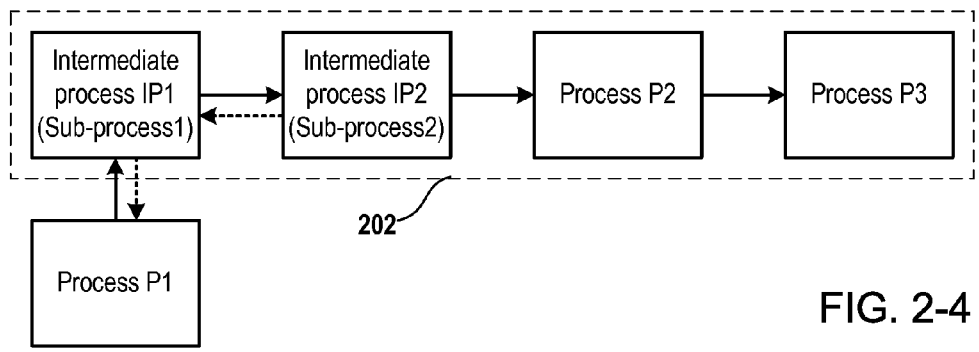
Figures 2, 3, 4, 5:
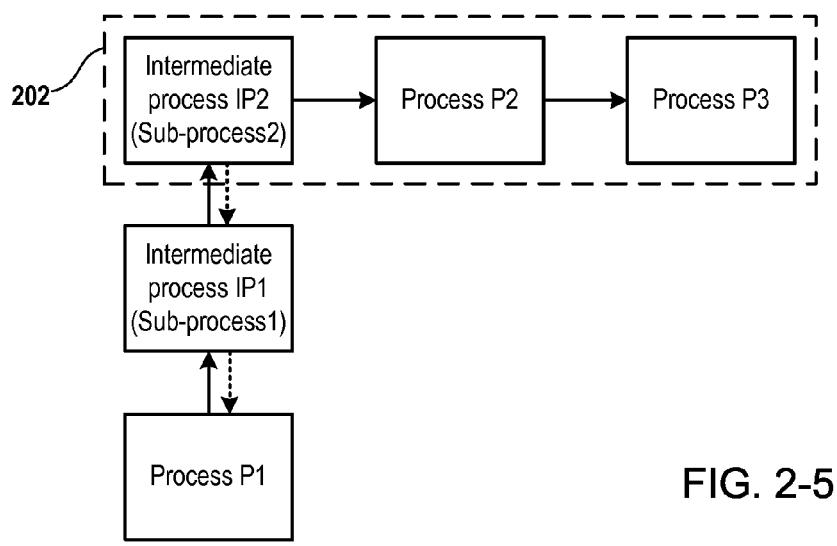
Figures 2, 3, 4, 5, 6:
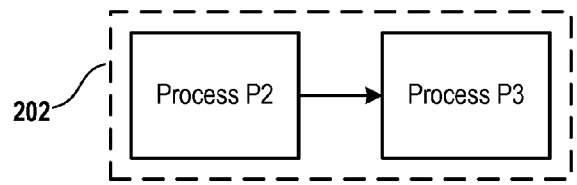
Figures 2, 3, 4, 5, 6, 7:
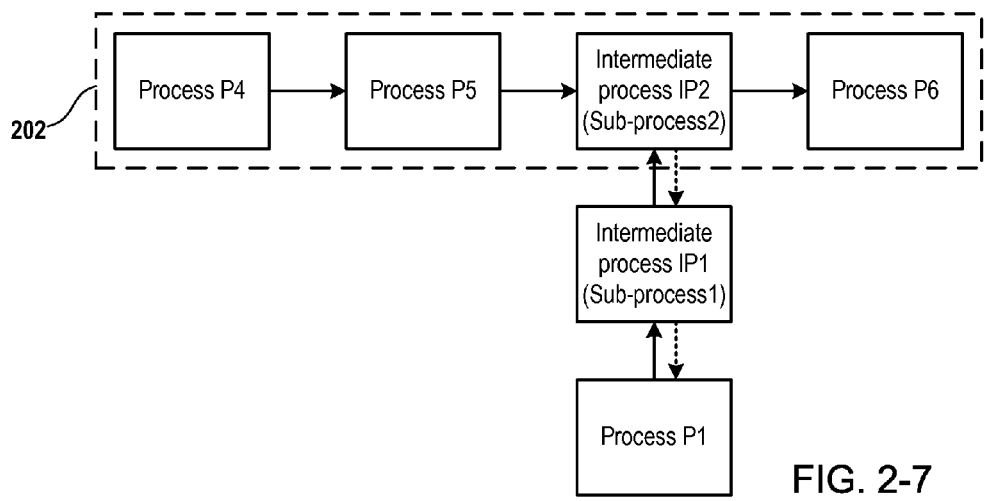
Figures 2, 3, 4, 5, 6, 7, 8:
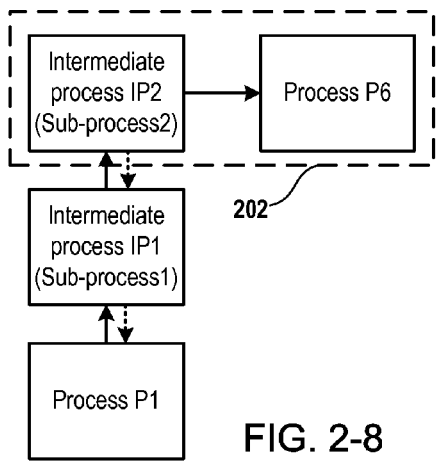
Figures 2, 3, 4, 5, 6, 7, 8, 9:
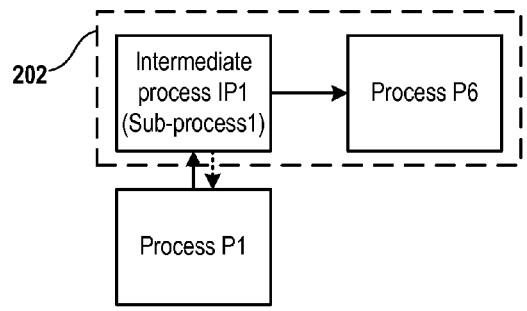
Figures 2, 3, 4, 5, 6, 7, 8, 9, 10:
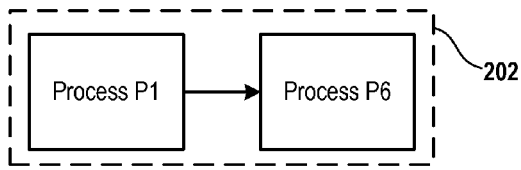
Figures 2, 3, 4, 5, 6, 7, 8, 9, 10, 11:
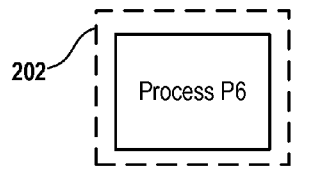
Figure 3:
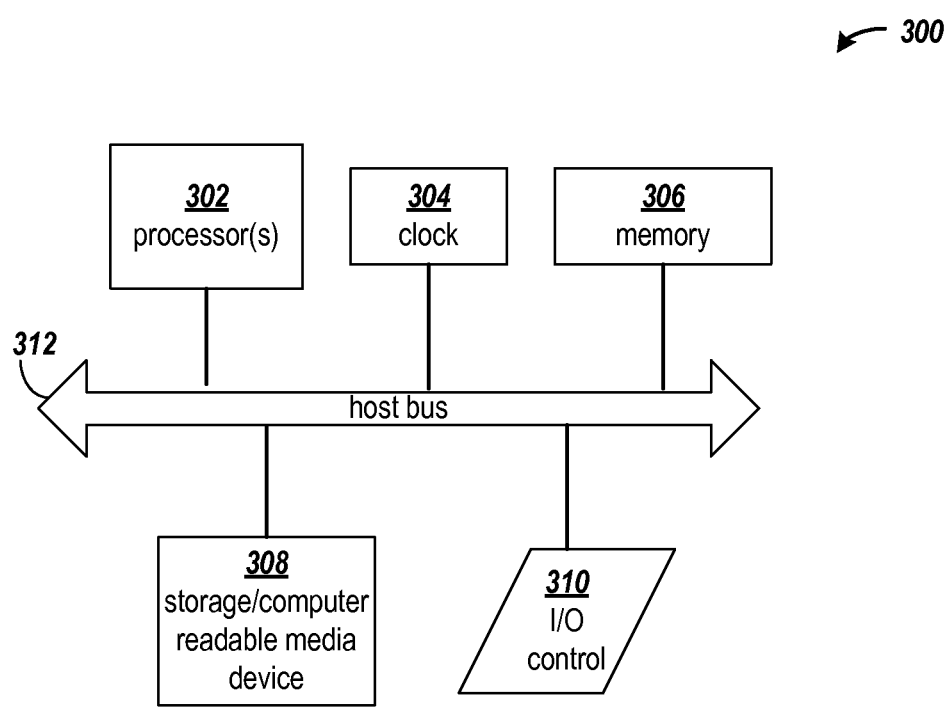

FIG. 2-4 illustrates the creation of a second intermediate process IP2 in response to encountering the procedure sub_process_2 during execution of sub_process_1. Similar to the process shown in FIG. 2-2, a back pointer is created to point from intermediate process IP2 to the calling process IP1. The mNext pointer of intermediate process IP2 is set to the next process P2 in the active process list 202 and the mNext pointer of intermediate process IP1 is set to point to the intermediate process IP2.

FIG. 2-5 illustrates the active process list 202 and call chain after IP1 is removed from the active process list 202. At this point, the kernel is configured to execute intermediate process IP2 in the same time slot as that of its caller intermediate process IP1. When executed, intermediate process IP2 is configured to call procedure sub_process_2.

During execution of sub_process_2, a wait statement is encountered and sub_process_2 needs to be suspended. The call chain of P1, IP1, and IP2 is suspended and intermediate process IP2 is removed from the active process list 202 as shown in FIG. 2-6. The simulation kernel begins execution of process P2 while waiting for the wait statement in IP2 to mature.

It is recognized that some of the processes may require more modeled clock cycles to complete than others. The simulation kernel may model each process for a specified time period using the loop illustrated in FIG. 1, and update signals input to each module or process after the loop completes execution of each process. Because each process is modeled for the same time period, a process may not complete in the time slot allotted. If a process does not complete, which happens if it encounters a wait statement, the kernel reschedules that processes for simulation at a later time slot—when the wait in the suspended process matures—in which the process resumes execution at the next code statement.

When a process calls a procedure, delays incurred by the sequential operations (except wait statements) of the process and procedure are modeled within this time slot. The simulation kernel is configured to execute a call chain of procedures using time slot allocated for the calling parent process until the procedure at the end of the call chain encounters a wait statement. When all active processes in a given time slot are exhausted—because each one of them encountered a wait statement either in their body or somewhere in their call chain of procedures—then the simulator advances the modeled time which causes it to move to the next time slot. Processes including intermediate processes, which should wakeup at this new time slot—whose wait statements have matured—are added to the active process list for this time slot, which is initially empty.

FIGS. 2-7 through 2-11 illustrate the scheduling of processes in the active process list 202 to model the processes for the next time period of the simulation. At this point, the wait statement encountered in the execution of procedure sub_process_2 has matured, and the P1, IP1, IP2 call chain is scheduled along with three other processes P4, P5, and P6 in the active process list 202 as shown in FIG. 2-7. The simulation kernel executes processes P4 and P5 and removed from the front of the active process list 202 in turn.

FIG. 2-8 illustrates resumption of execution of sub_process_2 after process P5 completes execution. When intermediate process IP2 is executed, the stored resumption pointer causes IP2 to resume execution of sub_process_2 at the statement following the previously encountered wait statement.

When procedure sub_process_2 completes execution, control returns to process IP2. When the intermediate process IP2 resumes execution, IP2 is removed from the active process list 202 and the calling process IP1, indicated by the previously created back pointer, is added to the front of the active process list 202 as shown in FIG. 2-9. The simulation kernel is configured to execute the calling process IP1 indicated by the back pointer in the same time slot as IP2. When IP1 is executed, a stored resumption pointer causes IP1 to resume execution of sub_process_1 at the statement following the call to sub_process_2.

When sub_process_1 completes execution, control is returned to intermediate process IP1. When the intermediate process IP1 resumes execution, IP1 is removed from the active process list 202 and the calling process P1, indicated by the previously created back pointer, is added to the front of the active process list 202 as shown in FIG. 2-10. The kernel is configured to resume execution of within the time slot of the call chain P1 at a saved resumption point as shown in FIG. 2-10. When process P1 completes execution, P1 is removed from the active process list 202 and process P6 is executed by the simulation kernel as shown by FIG. 2-11.

FIG. 3 shows a block diagram of an example computing arrangement on which the processes described herein may be implemented. It will be appreciated that various alternative computing arrangements, including one or more processors and a memory arrangement configured with program code, would be suitable for hosting the processes and data structures and implementing the algorithms of the different embodiments. The computer code, which implements the processes described herein as encoded in a processor executable format, may be stored and provided via a variety of computer-readable storage media or delivery channels such as magnetic or optical disks or tapes, electronic storage devices, or as application services over a network.

Processor computing arrangement 300 includes one or more processors 302, a clock signal generator 304, a memory unit 306, a storage unit 308, and an input/output control unit 310 coupled to host bus 312. The arrangement 300 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 302 may be one or more general purpose processors, or a combination of one or more general purpose processors and suitable co-processors, or one or more specialized processors (e.g., RISC, CISC, pipelined, etc.).

The memory arrangement 306 typically includes multiple levels of cache memory, and a main memory. The storage arrangement 308 may include local and/or remote persistent storage, such as provided by magnetic disks (not shown), flash, EPROM, or other non-volatile data storage. The storage unit may be read or read/write capable. Further, the memory 306 and storage 308 may be combined in a single arrangement.

The processor arrangement 302 executes the software in storage 308 and/or memory 306 arrangements, reads data from and stores data to the storage 308 and/or memory 306 arrangements, and communicates with external devices through the input/output control arrangement 310. These functions are synchronized by the clock signal generator 304. The resource of the computing arrangement may be managed by either an operating system (not shown), or a hardware control unit (not shown).

The embodiments are thought to be applicable to a variety of systems for HDL simulation. Other aspects and embodiments will be apparent from consideration of the specification. It is intended that the specification and illustrated embodiments be considered as examples only, with a true scope and spirit of the disclosure being indicated by the following claims.

What is claimed is:

1. A method of simulating a circuit design, comprising using one or more processors to perform steps including:
scheduling one or more processes that are specified in a hardware description language (HDL) description of the circuit design in an active process set, the active process set indicating processes to be modeled as concurrently executing processes;
simulating concurrent execution of the one or more processes in the active process set, the simulating execution of each of one or more processes including:
in response to a first process of the one or more processes calling a procedure specified by the HDL description:
generating a second process configured to trigger execution of the procedure;
halting simulation of concurrent execution of the one or more processes;
replacing the first process in the active process set with the second process; and
resuming simulation of concurrent execution of the one or more processes within the active process set, beginning with simulation of the second process; and
in response to completing simulation of the second process:
halting simulation of concurrent execution of the one or more processes;
replacing the second process in the active process set with the first process; and
resuming simulation of concurrent execution of one or more processes within the active process set, beginning with resuming simulation of the first process.

2. The method of claim 1, wherein replacing the first process with the second process in the active process set includes:
storing a first data value indicating a next statement of the first process following the call to the procedure.

3. The method of claim 2, wherein resuming simulation of the first process resumes simulation at the next statement indicated by the first data value.

4. The method of claim 2, further comprising, in response to encountering a wait statement in the second process:
storing a second data value indicating a next statement to execute in the procedure following the wait statement; and
removing the second process from the active process set.

5. The method of claim 4, further comprising, in response to expiration of a period of time indicated by the wait statement:
adding the second process to the set of active processes;
simulating concurrent execution of processes within the active process set; and
wherein, the second process is configured to resume execution of the procedure at the statement indicated by the second data value.

6. The method of claim 1, wherein replacing the first process with the second process includes:
setting a first pointer associated with the second process to be equal to a first pointer associated with the first process indicating a process of the active process set that is scheduled to be executed by the simulation kernel after executing the second process; and
setting a second pointer associated with the second process, indicating the parent process of the second process, to indicate the first process.

7. The method of claim 1, wherein scheduling the one or more processes in an active process set includes creating a first data structure for each respective process, the first data structure having a plurality of variables including:
a first pointer indicating the respective process;
a second pointer indicating a next process in the active process set; and
a data value indicating a next statement of the process to be executed.

8. The method of claim 7, wherein the generating of the second process to trigger execution of the procedure includes creating an instance of the first data structure for the second process and creating an instance of a second data structure having a plurality of data variables including:
a first pointer to the procedure;
a second pointer indicating the first process calling the procedure; and
a data value indicating whether the procedure has completed execution.

9. The method of claim 1, wherein:
the circuit design specification is in VHDL (VHSIC (Very High Speed Integrated Circuits) hardware description language) format;
the one or more processes are VHDL processes; and
the procedure is a VHDL procedure.

10. The method of claim 1, wherein:
the circuit design specification is in Verilog format;
the one or more processes are Verilog always or initial blocks; and
the procedure is a Verilog task.

11. A method for compiling an HDL specification for simulation, the method comprising using one or more processors to perform steps including:
for each call to a procedure by a calling process, replacing the call to the procedure with HDL code that, during simulation, performs operations including:
dynamically creating an intermediate process; and
replacing the calling process with the intermediate process in an active process list of processes scheduled for execution by a simulator to create a modified HDL specification, the intermediate process being configured to:
call the procedure; and
in response to completing execution of the procedure, cause the simulator to add the calling process to a front of the active process list and remove the intermediate process from the active process list;
compiling the modified HDL specification into code executable on the simulator; and
storing the compiled executable code.

12. The method of claim 11, wherein the intermediate process causes the simulator, in response to a wait statement encountered during execution of the procedure, to perform operations including:
halting execution of the procedure;
storing a resumption point indicating a statement of the procedure following the wait statement; and
removing the intermediate process from the active process list.

13. The method of claim 12, wherein:
the code executable on the simulator causes the simulator to add the intermediate process to the active process list upon expiration of a period of time indicated by the wait statement; and
the intermediate process, when executed following the expiration of the period of time indicated by the wait statement, is configured to resume execution of the procedure at the statement indicated by the resumption point.

14. The method of claim 13, wherein the intermediate process further causes the simulator to store a local variable of the procedure resumption point in response to the wait statement encountered during execution of the procedure.

15. A system for simulating a circuit design specification, comprising:
a processor; and
a memory unit coupled to the processor;
wherein the processor and memory are configured to perform operations including:
scheduling one or more processes that are specified in a hardware description language (HDL) description of the circuit design in an active process set, the active process set indicating processes to be modeled as concurrently executed processes; and
simulating concurrent execution of the one or more processes in the active process set, and in response to a first process of the one or more processes calling a procedure specified by the HDL description, performing operations including:
generating a second process configured to trigger execution of the procedure;
halting simulation of concurrent execution of the one or more processes;
replacing the first process in the active process set with the second process;
resuming simulation of concurrent execution of the one or more processes within the active process set, beginning with simulation of the second process; and
in response to completing simulation of the second process:
halting simulation of concurrent execution of the one or more processes;
replacing the second process in the active process set with the first process; and
resuming simulation of concurrent execution of one or more processes within the active process set, beginning with resuming simulation of the first process.

16. The system of claim 15, wherein the replacing of the first process in the active process set with the second process includes storing a first data value indicating a next statement of the first process following the call to the procedure.

17. The system of claim 16, wherein resuming simulation of the first process resumes simulation at the statement indicated by the first data value.

18. The system of claim 16, wherein the processor and memory are further configured to, in response to encountering a wait statement in the second process, perform operations including:
storing a second data value indicating the next statement to execute in the procedure following the wait statement; and
removing the second process from the active process set.

19. The system of claim 18, wherein:
the processor and memory are further configured to, in response to expiration of a period of time indicated by the wait statement, perform steps including:
adding the second process to the set of active processes; and
simulating concurrent execution of processes within the active process set; and
the second process is configured to resume execution of the procedure at the statement indicated by the second data value.

20. The system of claim 15, wherein replacing the first process with the second process includes:
setting a first pointer associated with the second process to be equal to a first pointer associated with the first process indicating a process of the active process set that is scheduled to be executed next by the simulation kernel after executing the second process; and
setting a second pointer associated with the second process, indicating the parent process of the second process, to indicate the first process.

* * * * *